US012761101B2

(12) United States Patent
Xu et al.

(10) Patent No.: US 12,761,101 B2
(45) Date of Patent: Oct. 13, 2026

(54) LIQUID LEAKAGE DETECTION SHEET AND LIQUID COOLING DEVICE

(71) Applicant: SHENZHEN ENVICOOL TECHNOLOGY CO., LTD., Shenzhen (CN)

(72) Inventors: Xiaoxin Xu, Shenzhen (CN); Xiaolei Ai, Shenzhen (CN)

(73) Assignee: SHENZHEN ENVICOOL TECHNOLOGY CO., LTD., Shenzhen (CN)

( * ) Notice: Subject to any disclaimer, the term of this patent is extended or adjusted under 35 U.S.C. 154(b) by 184 days.

(21) Appl. No.: 18/814,635

(22) Filed: Aug. 26, 2024

(65) Prior Publication Data

US 2025/0237571 A1 Jul. 24, 2025

(30) Foreign Application Priority Data

Jan. 19, 2024 (CN) ......................... 202410084476.1

(51) Int. Cl.
*G01M 3/04* (2006.01)
*G01M 3/16* (2006.01)
*H05K 7/20* (2006.01)

(52) U.S. Cl.
CPC ........ *G01M 3/165* (2013.01); *H05K 7/20272* (2013.01); *H05K 7/20763* (2013.01)

(58) Field of Classification Search
CPC ........ G01M 3/165; G01M 3/16; G01M 3/182; H05K 7/20272; H05K 7/20763; H05K 7/20218; H05K 7/20772; F17D 5/06
See application file for complete search history.

(56) References Cited

U.S. PATENT DOCUMENTS

2003/0101799 A1* 6/2003 Huang .................... G01M 3/16 73/40

FOREIGN PATENT DOCUMENTS

CN 219301922 U * 7/2023 ............ G01M 3/045
KR 20220097706 A * 7/2022 ............ G01M 3/045

* cited by examiner

*Primary Examiner* — Alesa Allgood
(74) *Attorney, Agent, or Firm* — Yue (Robert) Xu; Apex Attorneys at Law, LLP

(57) ABSTRACT

A liquid leakage detection sheet includes a base sheet, a first liquid leakage detection wire, and a second liquid leakage detection wire. A shape of a top view projection of the base sheet fits a shape of a top view projection of an inner bottom surface of a liquid collection groove. The base sheet is laid on the inner bottom surface of the liquid collection groove, and the first liquid leakage detection wire and the second liquid leakage detection wire are distributed on the base sheet in a curved manner. With the curved distribution, the detection scope of the liquid leakage detection band is improved, thereby increasing the precision of the liquid leakage detection. Therefore, the liquid leakage detection sheet according to the present application can be effectively applied to a large area of liquid leakage, and is also applicable to liquid leakage detection of a liquid supply pipeline.

17 Claims, 4 Drawing Sheets

LIQUID LEAKAGE DETECTION SHEET AND LIQUID COOLING DEVICE

CROSS REFERENCE TO RELATED APPLICATIONS

This application claims the priorities to Chinese patent application No. 202410084476.1, titled "LIQUID LEAKAGE DETECTION SHEET AND LIQUID COOLING DEVICE", filed with the China National Intellectual Property Administration Jan. 19, 2024, the entire disclosure of which is hereby incorporated by reference.

FIELD

The present application relates to the technical field of liquid cooling devices, and in particular to a liquid leakage detection sheet and a liquid cooling device.

BACKGROUND

A server generates a huge amount of heat during operation. In order to ensure the normal operation of the server, a cooling device is needed to dissipate the heat of the server. The cooling device generally falls into two categories: an air cooling device and a liquid cooling device. The liquid cooling device is widely used due to its advantages of fast heat dissipation, low noise and energy consumption, and good applicability to environments.

Liquid leakage may occur during the operation of the cooling device. Once the leakage contacts an electronic element of the server, the electronic element and even the entire server may be damaged, causing severe results such as data loss.

A liquid leakage detection band is mainly used for liquid leakage detection at present. Generally, the liquid leakage detection band is only suitable for detecting the leakage in a liquid supply pipeline, but it is not appropriate for liquid leakage detection in a large area.

SUMMARY

A liquid leakage detection sheet is provided according to the present application, which can be effectively applied to liquid leakage detection in a large area. A liquid cooling device having the liquid leakage detection sheet is further provided according to the present application.

A liquid leakage detection sheet includes a base sheet, a first liquid leakage detection wire, and a second liquid leakage detection wire;

- a shape of a top view projection of the base sheet fits a shape of a top view projection of an inner bottom surface of a liquid collection groove; and
- the base sheet is configured to be laid on the inner bottom surface of the liquid collection groove, and the first liquid leakage detection wire and the second liquid leakage detection wire are distributed on the base sheet in a bending manner.

In some embodiments, the first liquid leakage detection wire includes a first main liquid leakage detection wire and at least one first branch liquid leakage detection wire, and the at least one first branch liquid leakage detection wire is connected to the first main liquid leakage detection wire;

- the second liquid leakage detection wire includes a second main liquid leakage detection wire and at least one second branch liquid leakage detection wire, and the at least one second branch liquid leakage detection wire is connected to the second main liquid leakage detection wire; and
- the first main liquid leakage detection wire and the at least one first branch liquid leakage detection wire are spaced apart from the second main liquid leakage detection wire and the at least one second branch liquid leakage detection wire.

In some embodiments, the first main liquid leakage detection wire and the second main liquid leakage detection wire are distributed continuously along an edge of an upper surface of the base sheet, and the at least one first branch liquid leakage detection wire and the at least one second branch liquid leakage detection wire are distributed within a scope enclosed by the first main liquid leakage detection wire and the second main liquid leakage detection wire.

In some embodiments, a side of the first main liquid leakage detection wire facing the at least one second branch liquid leakage detection wire is provided with at least one first main detection sheet, and a side of the at least one second branch liquid leakage detection wire facing the first main liquid leakage detection wire is provided with at least one second branch detection sheet; and

- a side of the second main liquid leakage detection wire facing the at least one first branch liquid leakage detection wire is provided with at least one second main detection sheet, and a side of the at least one first branch liquid leakage detection wire facing the second main liquid leakage detection wire is provided with at least one first branch detection sheet.

In some embodiments, two sides of the at least one first branch liquid leakage detection wire are each provided with at least one first branch detection sheet, and two sides of the at least one second branch liquid leakage detection wire are each provided with at least one second branch detection sheet;

- the at least one first branch detection sheet at the side of the at least one first branch liquid leakage detection wire facing the second main liquid leakage detection wire and the at least one second main detection sheet are distributed alternatively, and the at least one first branch detection sheet at the other side of the at least one first branch liquid leakage detection wire and the at least one second branch detection sheet are distributed alternatively; and
- the at least one second branch detection sheet at the side of the at least one second branch liquid leakage detection wire facing the first main liquid leakage detection wire and the at least one first main detection sheet are distributed alternatively, and the at least one second branch detection sheet at the other side of the at least one second branch liquid leakage detection wire and the at least one first main detection sheet are distributed alternatively.

In some embodiments, the at least one first branch detection sheet at one side of the at least one first branch liquid leakage detection wire and the at least one first branch detection sheet at the other side of the at least one first branch liquid leakage detection wire are distributed in a staggered manner, and the at least one second branch detection sheet at one side of the at least one second branch liquid leakage detection wire and the at least one second branch detection sheet at the other side of the at least one second branch liquid leakage detection wire are distributed in a staggered manner.

In some embodiments, a bottom plate of the liquid collection groove is provided with a liquid filling connector, a liquid return connector and a suction region, the base sheet is provided with a liquid filling avoidance port for avoiding the liquid filling connector and a liquid return avoidance port for avoiding the liquid return connector, and the base sheet is provided with a liquid suction avoidance port for avoiding the suction region.

In some embodiments, a first lead out terminal of the first liquid leakage detection wire and the second liquid leakage detection wire is close to the liquid filling avoidance port, and a second lead out terminal of the first liquid leakage detection wire and the second liquid leakage detection wire is close to the liquid return avoidance port.

In some embodiments, a bottom plate of the liquid collection groove is provided with a suction region, and the base sheet is provided with a liquid suction avoidance port for avoiding the suction region.

In some embodiments, the liquid leakage detection sheet includes a first break detection wire and a second break detection wire that are provided on the base sheet;

- the first break detection wire is located at an outer side of the first liquid leakage detection wire, and is spaced apart from the first liquid leakage detection wire; and
- the second break detection wire is located at an outer side of the second liquid leakage detection wire, and is spaced apart from the second liquid leakage detection wire.

A liquid cooling device includes and the liquid collection groove the liquid leakage detection sheet according to any one of the above solutions, and the liquid leakage detection sheet is configured to be laid on the inner bottom surface of the liquid collection groove.

Compared with the prior art, the above technical solutions have the following advantages.

In the liquid leakage detection sheet and the liquid cooling device according to the present application, the shape of the top view projection of the base sheet fits the shape of the top view projection of the inner bottom surface of the liquid collection groove, hence the base sheet can be fully laid on the inner bottom surface of the liquid collection groove. Compared with a solution in the prior art that a liquid leakage detection band is attached on the inner bottom surface of the liquid collection groove in a curved manner, the solutions according to the present application not only facilitates assembling of the liquid leakage detection sheet, but also prevents the first liquid leakage detection wire and the second liquid leakage detection wire from being broken due to being bent, while the liquid leakage detection band cannot be laid smoothly when being laid in a curved manner. Therefore, the liquid leakage detection sheet according to the present application can be effectively applied to a large area of liquid leakage, and is also applicable to liquid leakage detection of a liquid supply pipeline. For example, the liquid leakage detection sheet is rolled to fit a curved structure of the liquid supply pipeline, such that the leakage can be detected in a wide range of angle in a circumferential direction of the liquid supply pipeline.

BRIEF DESCRIPTION OF THE DRAWINGS

For more clearly illustrating embodiments of the present application or the technical solutions in the prior art, drawings referred to describe the embodiments or the prior art will be briefly described hereinafter. Apparently, the drawings in the following descriptions are only examples of the present application, and for those skilled in the art, other drawings may be obtained based on these drawings without any creative efforts.

REFERENCE NUMERALS

10 base sheet,
11 liquid filling avoidance port,
12 liquid return avoidance port,
13 liquid suction avoidance port,
20 first liquid leakage detection wire,
21 first main liquid leakage detection wire,
211 first main detection sheet,
22 first branch liquid leakage detection wire,
221 first branch detection sheet,
30 second liquid leakage detection wire,
31 second main liquid leakage detection wire,
311 second main detection sheet,
32 second branch liquid leakage detection wire,
321 second branch detection sheet,
40 first lead out terminal,
50 second lead out terminal,
60 first break detection wire,
70 second break detection wire,
80 liquid collection groove,
81 liquid filling connector,
82 liquid return connector,
83 liquid suction region.

DETAILED DESCRIPTION OF THE EMBODIMENTS

Technical solutions according to the embodiments of the present application will be described clearly and completely as follows in conjunction with the accompany drawings in the embodiments of the present application. It is obvious that the described embodiments are only a part of the embodiments of the present application, rather than all of the embodiments. All the other embodiments obtained by those skilled in the art based on the embodiments in the present application without any creative work belong to the scope of protection of the present application.

Figure 1:
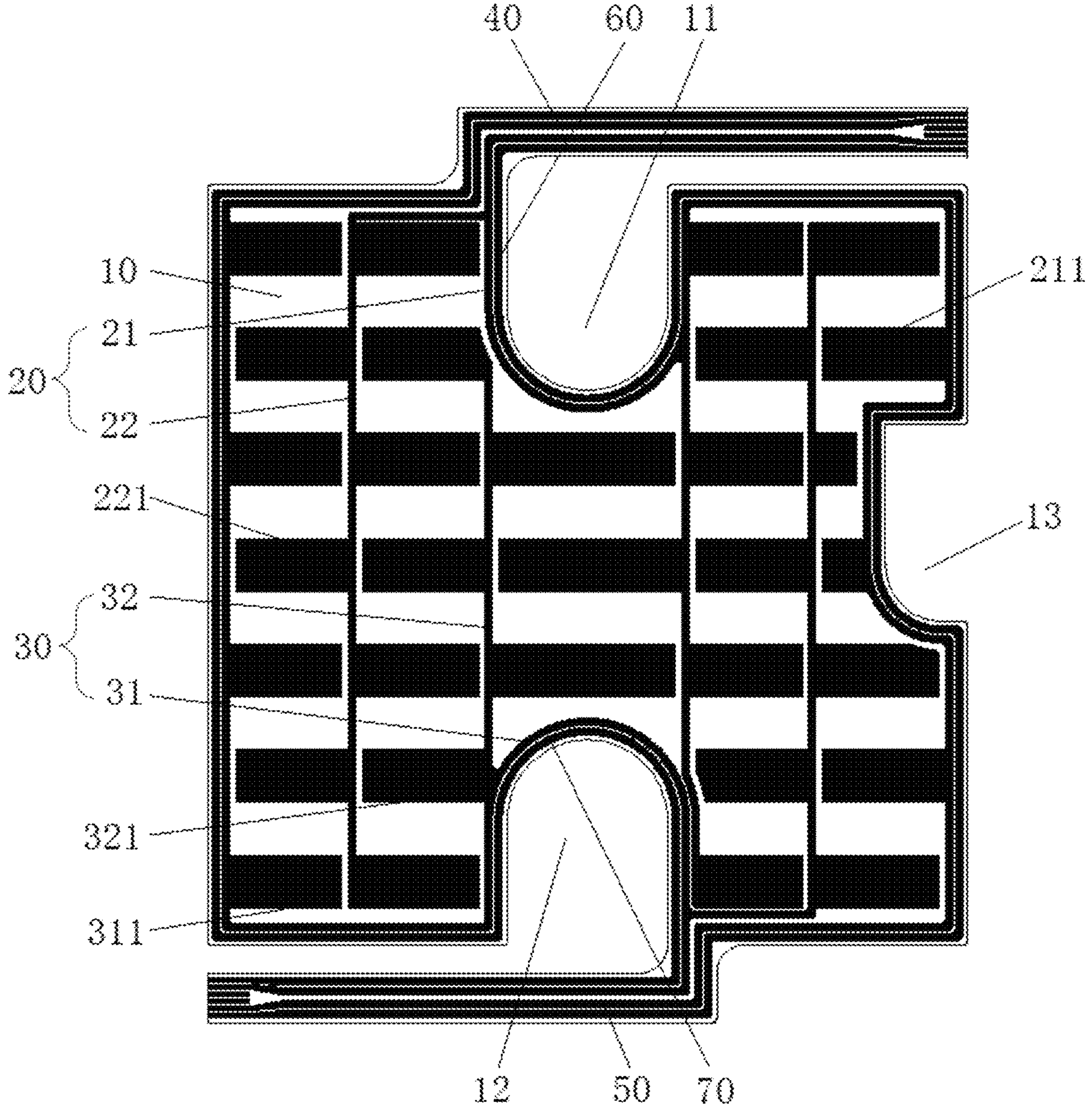
FIG. 1 is a schematic structural view of a liquid leakage detection sheet according to an embodiment of the present application.
Figure 3:
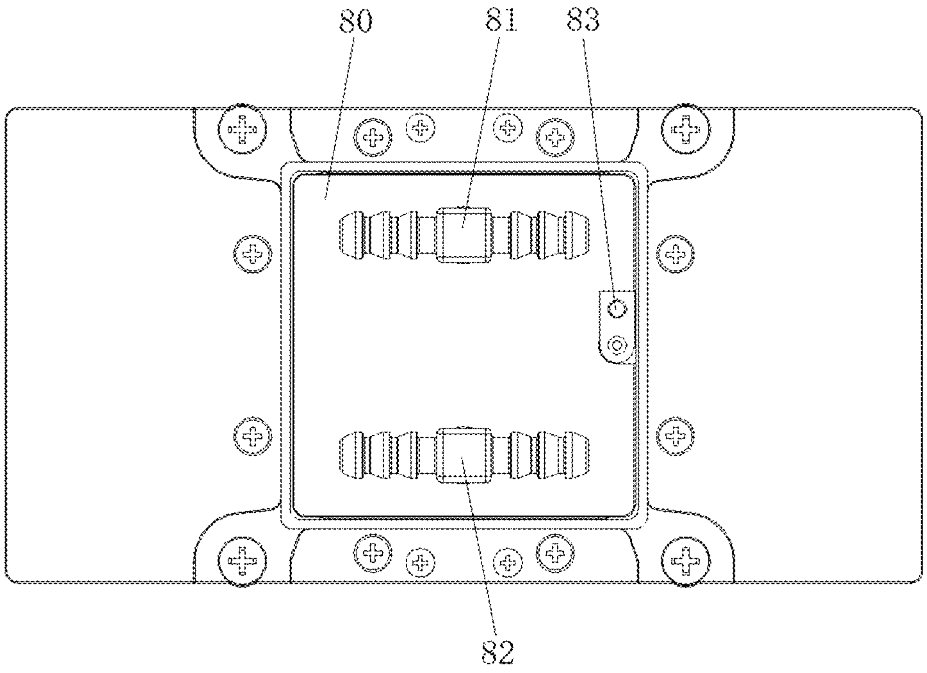
FIG. 3 is a schematic top view showing the structure of a liquid collection groove of a liquid cooling device according to an embodiment of the present application.
Figure 4:
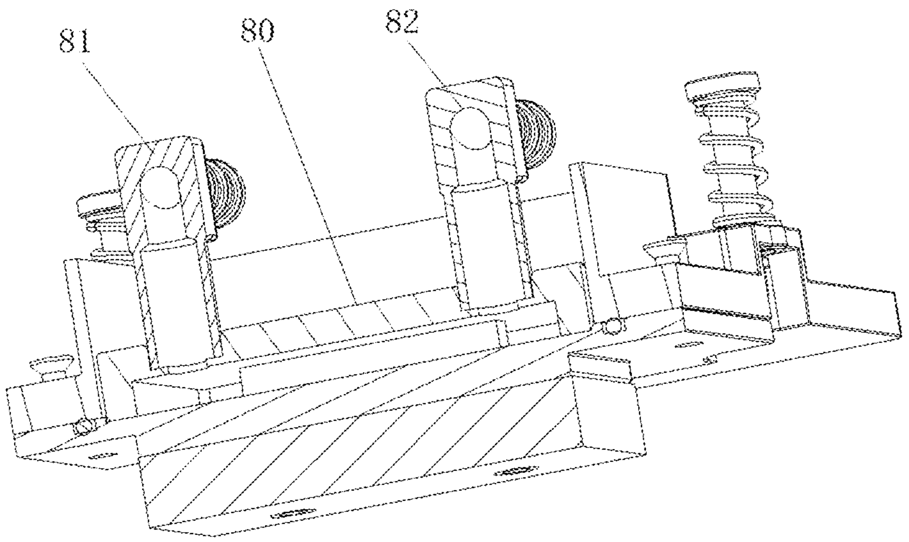
FIG. 4 is a schematic sectional view showing the structure of the liquid collection groove of the liquid cooling device according to the embodiment of the present application.

Referring to FIG. 1 and FIG. 3, a liquid leakage detection sheet according to the present application includes a base sheet 10, a first liquid leakage detection wire 20, and a second liquid leakage detection wire 30. A shape of a top view projection of the base sheet 10 fits a shape of a top view projection of an inner bottom surface of a liquid collection groove 80. The liquid collection groove 80 can collect liquid leakage from a liquid cooling device. If the inner bottom surface of the liquid collection groove 80 is rectangular, the base sheet 10 is also rectangular. If the inner bottom surface of the liquid collection groove 80 is of other shapes, the shape of the base sheet 10 fits the shape of the liquid collection groove 80. The base sheet 10 may be laid on the inner bottom surface of the liquid collection groove 80. The base sheet 10 and the inner bottom surface of the liquid collection groove 80 may be fixed by bonding or by other means. The first liquid leakage detection wire 20 and the second liquid leakage detection wire 30 are distributed on the base sheet 10 respectively in a bending manner. The first liquid leakage detection wire 20 and the second liquid leakage detection wire 30 may be integrally formed on the base sheet 10 by electroplating. If the liquid leakage contacts the first liquid leakage detection wire 20 and the second liquid leakage detection wire 30 at the same time, the first liquid leakage detection wire 20 and the second liquid leakage detection wire 30 are short-circuited, thus the leakage can be detected. With the bending distribution, the detection scope of a liquid leakage detection band is improved, thereby increasing the precision of the liquid leakage detection. Compared with a solution that a liquid leakage detection band is attached on the inner bottom surface of the liquid collection groove 80 in a curved manner in the conventional art, the solution according to the present application not only facilitates assembling of the liquid leakage detection sheet, but also prevents the first liquid leakage detection wire 20 and the second liquid leakage detection wire 30 from being broken due to being bent. In addition, the liquid leakage detection band cannot be laid smoothly when being laid in a curved manner. Therefore, the liquid leakage detection sheet according to the present application can be effectively applied to a large area of liquid leakage, and is also suitable for liquid leakage detection of a liquid supply pipeline. For example, the liquid leakage detection sheet is rolled to fit an arc structure of the liquid supply pipeline, such that the leakage can be detected in a wide range of angle of the liquid supply pipeline.

In some embodiments, the first liquid leakage detection wire 20 includes a first main liquid leakage detection wire 21 and at least one first branch liquid leakage detection wire 22, and the at least one first branch liquid leakage detection wire 22 is connected to the first main liquid leakage detection wire 21. Two ends of the first main liquid leakage detection wire 21 are connected to a liquid leakage detector, or connected to another liquid leakage detection band or liquid leakage detection sheet. The second liquid leakage detection wire 30 includes a second main liquid leakage detection wire 31 and at least one second branch liquid leakage detection wire 32, and the at least one second branch liquid leakage detection wire 32 is connected to the second main liquid leakage detection wire 31. Two ends of second main liquid leakage detection wire 31 are connected to a liquid leakage detector, or connected to another liquid leakage detection band or liquid leakage detection sheet. The first main liquid leakage detection wire 21 and the first branch liquid leakage detection wire 22 are spaced apart from the second main liquid leakage detection wire 31 and the second branch liquid leakage detection wire 32. That is, the first main liquid leakage detection wire 21 is spaced apart from the second main liquid leakage detection wire 31 and the second branch liquid leakage detection wire 32, and the first branch liquid leakage detection wire 22 is also spaced apart from the second main liquid leakage detection wire 31 and the second branch liquid leakage detection wire 32. With the first branch liquid leakage detection wire 22 and the second branch liquid leakage detection wire 32 distributed on the base sheet 10, the precision of the liquid leakage detection of the liquid leakage detection sheet is effectively enhanced.

Figure 2:
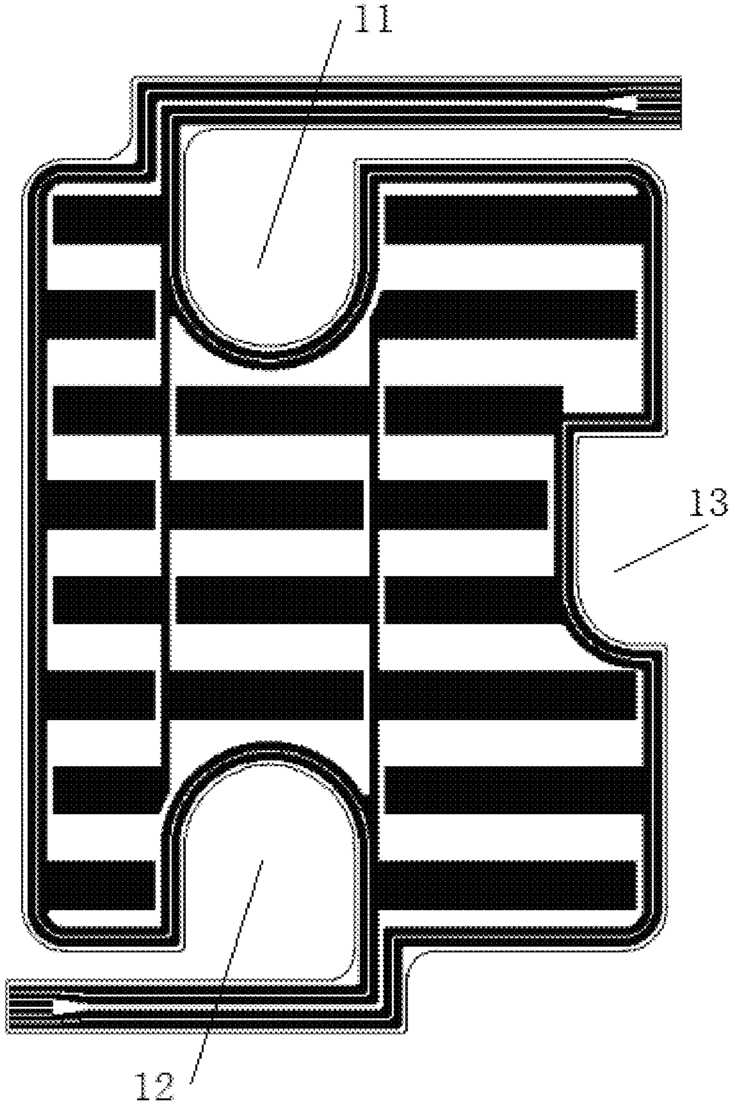
FIG. 2 is a schematic structural view of a liquid leakage detection sheet according to another embodiment of the present application.

In some embodiments, as shown in FIG. 1 and FIG. 2, the first main liquid leakage detection wire 21 and the second main liquid leakage detection wire 31 are distributed continuously along an edge of an upper surface of the base sheet 10, and the first branch liquid leakage detection wire 22 and the second branch liquid leakage detection wire 32 are distributed within a scope enclosed by the first main liquid leakage detection wire 21 and the second main liquid leakage detection wire 31. As shown in FIG. 1, the first main liquid leakage detection wire 21 is provided with two first branch liquid leakage detection wires 22, and the second main liquid leakage detection wire 31 is provided with two second branch liquid leakage detection wires 32. The two first branch liquid leakage detection wires 22 and the two second branch liquid leakage detection wires 32 are distributed alternatively. As shown in FIG. 2, the first main liquid leakage detection wire 21 is provided with one first branch liquid leakage detection wire 22, and the second main liquid leakage detection wire 31 is provided with one second branch liquid leakage detection wire 32. The first branch liquid leakage detection wire 22 and the second branch liquid leakage detection wire 32 are located at a middle of the base sheet 10. If the inner bottom surface of the liquid collection groove has a relatively large area, a liquid leakage detection sheet with more first branch liquid leakage detection wires 22 and second branch liquid leakage detection wires 32 may be employed as shown in FIG. 1. If the inner bottom surface of the liquid collection groove has a relatively small area, a liquid leakage detection sheet with fewer first branch liquid leakage detection wires 22 and second branch liquid leakage detection wires 32 may be employed as shown in FIG. 2.

In some embodiments, as shown in FIG. 1 and FIG. 2, a side of the first main liquid leakage detection wire 21 facing the second branch liquid leakage detection wire 32 is provided with at least one first main detection sheet 211, and multiple first main detection sheets 211 are equally spaced or unequally spaced. A side of the second branch liquid leakage detection wire 32 facing the first main liquid leakage detection wire 21 is provided with at least one second branch detection sheet 321, and multiple second main detection sheets 321 are equally spaced or unequally spaced. A side of the second main liquid leakage detection wire 31 facing the first branch liquid leakage detection wire 22 is provided with at least one second main detection sheet 311, and multiple second main detection sheets 311 are equally spaced or unequally spaced. A side of the first branch liquid leakage detection wire 22 facing the second main liquid leakage detection wire 31 is provided with at least one first branch detection sheet 221, and multiple first branch detection sheets 221 are equally spaced or unequally spaced. The liquid leakage can be detected when the leakage contacts the first main liquid leakage detection wire and the second main liquid leakage detection wire 31 at the same time, or contacts the first main liquid leakage detection wire 21 and the second branch liquid leakage detection wire 32 at the same time, or contacts the second main liquid leakage detection wire 31 and the first branch liquid leakage detection wire 22 at the same time, or contacts the first main detection sheet 211 and the second branch detection sheet 321 at the same time, or contacts the first main detection sheet 211 and the second branch liquid leakage detection wire 32 at the same time, or contacts the second main detection sheet 311 and the first branch detection sheet 221 at the same time, or contacts the second main detection sheet 311 and the first branch liquid leakage detection wire 22 at the same time.

It should be noted that, the first branch liquid leakage detection wire 22 and the second branch liquid leakage detection wire 32 may be arranged on the base sheet 10 close to the edge, and a segment of the first main liquid leakage detection wire 21 and a segment of the second main liquid leakage detection wire 31 that contact the liquid leakage may be arranged at the middle or close the middle of the base sheet 10. Alternatively, the first branch liquid leakage detection wire 22 and the second branch liquid leakage detection wire 32 are distributed on one half of the upper surface of the base sheet, and the first main liquid leakage detection wire 21 and the second main liquid leakage detection wire 31 are distributed on the other half of the upper surface of the base sheet. Since the first branch liquid leakage detection wire and the second branch liquid leakage detection wire are not directly connected to the liquid leakage detector, or another liquid leakage detection band, or another liquid leakage detection sheet, the first branch liquid leakage detection wire may be partially or completely cut from the first main liquid leakage detection wire, and the second branch liquid leakage detection wire may be partially or completely cut from the second main liquid leakage detection wire, such that the liquid leakage detection sheet is applicable to liquid leakage detection with different areas.

In some embodiments, as shown in FIG. 1 and FIG. 2, two sides of the at least one first branch liquid leakage detection wire 22 are each provided with at least one first branch detection sheet 221, and two sides of the at least one second branch liquid leakage detection wire 32 are each provided with at least one second branch detection sheet 321. The first branch detection sheet 221 at the side of the first branch liquid leakage detection wire 22 facing the second main liquid leakage detection wire 31 and the second main detection sheet 311 are distributed alternatively, and the first branch detection sheet 221 at the other side of the a first branch liquid leakage detection wire 22 and the second branch liquid leakage detection wire 321 are distributed alternatively. The second branch detection sheet 321 at the side of the second branch liquid leakage detection wire 32 facing the first main liquid leakage detection wire 21 and the first main detection sheet 211 are distributed alternatively, and the second branch detection sheet 321 at the other side of the second branch liquid leakage detection wire 32 and the first branch liquid leakage detection wire 221 are distributed alternatively. The two sides of the first branch liquid leakage detection wire 22 are each provided with the first branch detection sheet 221, which facilitates the arrangement of the first branch liquid leakage detection wire between the second main liquid leakage detection wire 31 and the second branch liquid leakage detection wire. The two sides of the second branch liquid leakage detection wire 32 are each provided with the second branch detection sheet 321, which facilitates the arrangement of the second branch liquid leakage detection wire 32 between the first main liquid leakage detection wire 21 and the first branch liquid leakage detection wire 22.

In some embodiments, the first branch detection sheets 221 at the two sides of the first branch liquid leakage detection wire 22 are distributed in a staggered manner. That is, the first branch detection sheets 221 at the two sides of the first branch liquid leakage detection wire 22 are located at different positions along a length direction of the first branch liquid leakage detection wire 22. The second branch detection sheets 321 at the two sides of the second branch liquid leakage detection wire 32 are distributed in a staggered manner. That is, the second branch detection sheets 321 at the two sides of the second branch liquid leakage detection wire 32 are located at different positions along a length direction of the second branch liquid leakage detection wire 32. The first main detection sheet 211 and the second branch detection sheet 321 of the second branch liquid leakage detection wire 32 away from the first main detection sheet 211 extend in a same direction, and the second main detection sheet 311 and the first branch detection sheet 221 of the first branch liquid leakage detection wire 22 away from the second main detection sheet 221 extend in a same direction. The first branch detection sheet 221 and the second branch detection sheet 321 at different sides extend in a same direction. For the specific arrangements, references are made to FIG. 1 and FIG. 2.

In some embodiments, a bottom plate of the liquid collection groove 80 is provided with a liquid filling connector 81 and a liquid return connector 82. The liquid filling connector 81 is for supplying a coolant to a bottom of the liquid collection groove 80, and the liquid return connector 82 is for discharging the coolant out of the bottom of the liquid collection groove 80 after heat exchange. The base sheet 10 is provided with a liquid filling avoidance port 11 for avoiding the liquid filling connector 81 and a liquid return avoidance port 12 for avoiding the liquid return connector 82. With the liquid filling avoidance port 11 and the liquid return avoidance port 12, the liquid filling connector 81 and the liquid return connector 82 are prevented from interfering with the liquid leakage detection sheet, thereby ensuring the liquid leakage detection sheet to be smoothly laid on the bottom plate of the liquid collection groove 80.

In some embodiments, as shown in FIG. 1 and FIG. 2, a first lead out terminal 40 of the first liquid leakage detection wire 20 and the second liquid leakage detection wire 30 is close to the liquid filling avoidance port 11, and a second lead out terminal 50 of the first liquid leakage detection wire 20 and the second liquid leakage detection wire 30 is close to the liquid return avoidance port 12. In a liquid cooling system, a liquid supply pipeline is connected to the liquid filling connector 81, and a liquid return pipeline is connected to the liquid return connector 82. The liquid supply pipeline and the liquid return pipeline are each provided with a liquid leakage detection band, and the liquid leakage detection bands extend out of the liquid supply pipeline and the liquid return pipeline. Therefore, according to the present application, the first lead out terminal 40 is arranged close to the liquid filling avoidance port 11, and the second lead out terminal 50 is arranged close to the liquid return avoidance port 12, thereby facilitating connections between the liquid leakage detection sheet and the liquid leakage detection bands.

In some embodiments, the bottom plate of the liquid collection groove 80 is provided with a liquid suction region 83, and the liquid suction region 83 is below an upper surface of the bottom plate, such that the liquid leakage collected by the liquid collection groove 80 flows to the liquid suction region 83. An inlet of a suction pipe may be provided at the liquid suction region 83, and the liquid leakage can be suctioned out of the liquid collection groove 80 through the suction pipe. The base sheet 10 is provided with a liquid suction avoidance port 13 for avoiding the liquid suction region 83. With the liquid suction avoidance port 13, the liquid leakage detection sheet is prevented from covering the liquid suction region 83, thereby ensuring the liquid leakage to flow to the liquid suction region 83.

In some embodiments, the liquid leakage detection sheet further includes a first break detection wire 60 and a second break detection wire 70 that are arranged on the base sheet 10. The first break detection wire 60 is located at an outer side of the first liquid leakage detection wire 20, and is spaced apart from the first liquid leakage detection wire 20. The second break detection wire 70 is located at an outer side of second liquid leakage detection wire 30, and is spaced apart from the second liquid leakage detection wire 30. Two ends of the first break detection wire 60 extend to the first lead out terminal 40 and the second lead out terminal 50 respectively, and two ends of the second break detection wire 70 extend to the first lead out terminal 40 and the second lead out terminal 50 respectively. The liquid leakage detector can detect whether the first liquid leakage detection wire 20 and the second liquid leakage detection wire 30 are broken through the first break detection wire 60 and the second break detection wire 70, such that the liquid leakage detection sheet can be repaired in time when the wires are broken.

A liquid cooling device is provided according to an embodiment of the present application. The liquid cooling device includes the liquid leakage detection sheet and the liquid collection groove 80 according to any one of the above solutions. The liquid leakage detection sheet is fully laid on the inner bottom surface of the liquid collection groove 80, and can be mounted on the inner bottom surface of the liquid collection groove 80 by bonding or by other fixation means. When the liquid leakage at a periphery of a bottom portion of the liquid collection groove 80 flows upwards to an upper surface of the liquid leakage detection sheet, or when the leakage drops downwards from the liquid filling connector 81 and the liquid return connector 82 onto the upper surface of the liquid leakage detection sheet, the liquid leakage detection sheet can detect the liquid leakage of the liquid cooling device.

It should be noted that, in this specification, relational terms such as "first" and "second" are merely intended to distinguish one entity from other entities, and do not require or imply any actual relationships or sequences among these entities.

The above embodiments in this specification are described in a progressive manner. Each of the embodiments is mainly focused on describing its differences from other embodiments, and references may be made among these embodiments with respect to the same or similar portions among these embodiments.

The liquid leakage detection sheet and the liquid cooling device according to the present application are described in detail hereinbefore. The principle and the embodiments of the present application are illustrated herein by specific examples. The above description of examples is only intended to help the understanding of the method and the idea of the present application. It should be noted that, for those skilled in the art, a few of modifications and improvements may be made to the present application without departing from the principle of the present application, and these modifications and improvements are deemed to fall into the protection scope of the present application defined by the claims.

The invention claimed is:

1. A liquid leakage detection sheet, comprising a base sheet, a first liquid leakage detection wire, and a second liquid leakage detection wire;

a shape of a top view projection of the base sheet fits a shape of a top view projection of an inner bottom surface of a liquid collection groove; and the base sheet is configured to be laid on the inner bottom surface of the liquid collection groove, and the first liquid leakage detection wire and the second liquid leakage detection wire are distributed on the base sheet in a bending manner and are exposed to the environment, wherein the first liquid leakage detection wire comprises a first main liquid leakage detection wire and at least one first branch liquid leakage detection wire, and the at least one first branch liquid leakage detection wire is connected to the first main liquid leakage detection wire;

the second liquid leakage detection wire comprises a second main liquid leakage detection wire and at least one second branch liquid leakage detection wire, and the at least one second branch liquid leakage detection wire is connected to the second main liquid leakage detection wire; and the first main liquid leakage detection wire and the at least one first branch liquid leakage detection wire are spaced apart from the second main liquid leakage detection wire and the at least one second branch liquid leakage detection wire, such that the liquid leakage is detected when the leakage contacts the first main liquid leakage detection wire and the second main liquid leakage detection wire at the same time, or contacts the first main liquid leakage detection wire and the second branch liquid leakage detection wire at the same time, or contacts the second main liquid leakage detection wire and the first branch liquid leakage detection wire at the same time, or contacts the first main detection sheet and the second branch detection sheet at the same time, or contacts the first main detection sheet and the second branch liquid leakage detection wire at the same time, or contacts the second main detection sheet and the first branch detection sheet at the same time, or contacts the second main detection sheet and the first branch liquid leakage detection wire at the same time.

2. The liquid leakage detection sheet according to claim 1, comprising a first break detection wire and a second break detection wire that are provided on the base sheet, wherein the first break detection wire is located at an outer side of the first liquid leakage detection wire, and is spaced apart from the first liquid leakage detection wire; and the second break detection wire is located at an outer side of the second liquid leakage detection wire, and is spaced apart from the second liquid leakage detection wire.

3. A liquid cooling device, comprising the liquid leakage detection sheet and the liquid collection groove according to claim 1, and the liquid leakage detection sheet is configured to be laid on an inner bottom surface of the liquid collection groove.

4. The liquid leakage detection sheet according to claim 1, wherein the first main liquid leakage detection wire and the second main liquid leakage detection wire are distributed continuously along an edge of an upper surface of the base sheet, and the at least one first branch liquid leakage detection wire and the at least one second branch liquid leakage detection wire are distributed within a scope enclosed by the first main liquid leakage detection wire and the second main liquid leakage detection wire.

5. The liquid leakage detection sheet according to claim 4, comprising a first break detection wire and a second break detection wire that are provided on the base sheet, wherein the first break detection wire is located at an outer side of the first liquid leakage detection wire, and is spaced apart from the first liquid leakage detection wire; and the second break detection wire is located at an outer side of the second liquid leakage detection wire, and is spaced apart from the second liquid leakage detection wire.

6. A liquid cooling device, comprising the liquid leakage detection sheet and the liquid collection groove according to claim 4, and the liquid leakage detection sheet is configured to be laid on an inner bottom surface of the liquid collection groove.

7. The liquid leakage detection sheet according to claim 1, wherein a bottom plate of the liquid collection groove is provided with a liquid filling connector, a liquid return connector and a liquid suction region; and the base sheet is provided with a liquid filling avoidance port for avoiding the liquid filling connector and a liquid return avoidance port for avoiding the liquid return connector, and the base sheet is provided with a liquid suction avoidance port for avoiding the liquid suction region.

8. The liquid leakage detection sheet according to claim 7, comprising a first break detection wire and a second break detection wire that are provided on the base sheet, wherein the first break detection wire is located at an outer side of the first liquid leakage detection wire, and is spaced apart from the first liquid leakage detection wire; and the second break detection wire is located at an outer side of the second liquid leakage detection wire, and is spaced apart from the second liquid leakage detection wire.

9. The liquid leakage detection sheet according to claim 7, wherein a first lead out terminal of the first liquid leakage detection wire and the second liquid leakage detection wire is close to the liquid filling avoidance port, and a second lead out terminal of the first liquid leakage detection wire and the second liquid leakage detection wire is close to the liquid return avoidance port.

10. The liquid leakage detection sheet according to claim 9, comprising a first break detection wire and a second break detection wire that are provided on the base sheet, wherein the first break detection wire is located at an outer side of the first liquid leakage detection wire, and is spaced apart from the first liquid leakage detection wire; and the second break detection wire is located at an outer side of the second liquid leakage detection wire, and is spaced apart from the second liquid leakage detection wire.

11. A liquid leakage detection sheet, comprising a base sheet, a first liquid leakage detection wire, and a second liquid leakage detection wire;

a shape of a top view projection of the base sheet fits a shape of a top view projection of an inner bottom surface of a liquid collection groove; and the base sheet is configured to be laid on the inner bottom surface of the liquid collection groove, and the first liquid leakage detection wire and the second liquid leakage detection wire are distributed on the base sheet in a bending manner, wherein the first liquid leakage detection wire comprises a first main liquid leakage detection wire and at least one first branch liquid leakage detection wire, and the at least one first branch liquid leakage detection wire is connected to the first main liquid leakage detection wire;

the second liquid leakage detection wire comprises a second main liquid leakage detection wire and at least one second branch liquid leakage detection wire, and the at least one second branch liquid leakage detection wire is connected to the second main liquid leakage detection wire; and the first main liquid leakage detection wire and the at least one first branch liquid leakage detection wire are spaced apart from the second main liquid leakage detection wire and the at least one second branch liquid leakage detection wire, wherein the first main liquid leakage detection wire and the second main liquid leakage detection wire are distributed continuously along an edge of an upper surface of the base sheet, and the at least one first branch liquid leakage detection wire and the at least one second branch liquid leakage detection wire are distributed within a scope enclosed by the first main liquid leakage detection wire and the second main liquid leakage detection wire, wherein a side of the first main liquid leakage detection wire facing the at least one second branch liquid leakage detection wire is provided with at least one first main detection sheet, and a side of the at least one second branch liquid leakage detection wire facing the first main liquid leakage detection wire is provided with at least one second branch detection sheet; and a side of the second main liquid leakage detection wire facing the at least one first branch liquid leakage detection wire is provided with at least one second main detection sheet, and a side of the at least one first branch liquid leakage detection wire facing the second main liquid leakage detection wire is provided with at least one first branch detection sheet.

12. The liquid leakage detection sheet according to claim 11, comprising a first break detection wire and a second break detection wire that are provided on the base sheet, wherein the first break detection wire is located at an outer side of the first liquid leakage detection wire, and is spaced apart from the first liquid leakage detection wire; and the second break detection wire is located at an outer side of the second liquid leakage detection wire, and is spaced apart from the second liquid leakage detection wire.

13. A liquid cooling device, comprising the liquid leakage detection sheet and the liquid collection groove according to claim 11, and the liquid leakage detection sheet is configured to be laid on an inner bottom surface of the liquid collection groove.

14. The liquid leakage detection sheet according to claim 11, wherein two sides of the at least one first branch liquid leakage detection wire are each provided with at least one first branch detection sheet, and two sides of the at least one second branch liquid leakage detection wire are each provided with at least one second branch detection sheet;

the at least one first branch detection sheet at the side of the at least one first branch liquid leakage detection wire facing the second main liquid leakage detection wire and the at least one second main detection sheet are distributed alternatively, and the at least one first branch detection sheet at the other side of the at least one first branch liquid leakage detection wire and the at least one second branch detection sheet are distributed alternatively; and the at least one second branch detection sheet at the side of the at least one second branch liquid leakage detection wire facing the first main liquid leakage detection wire and the at least one first main detection sheet are distributed alternatively, and the at least one second branch detection sheet at the other side of the at least one second branch liquid leakage detection wire and the at least one first main detection sheet are distributed alternatively.

15. The liquid leakage detection sheet according to claim 14, comprising a first break detection wire and a second break detection wire that are provided on the base sheet, wherein the first break detection wire is located at an outer side of the first liquid leakage detection wire, and is spaced apart from the first liquid leakage detection wire; and the second break detection wire is located at an outer side of the second liquid leakage detection wire, and is spaced apart from the second liquid leakage detection wire.

16. The liquid leakage detection sheet according to claim 14, wherein the at least one first branch detection sheet at one side of the at least one first branch liquid leakage detection wire and the at least one first branch detection sheet at the other side of the at least one first branch liquid leakage detection wire are distributed in a staggered manner, and the at least one second branch detection sheet at one side of the at least one second branch liquid leakage detection wire and the at least one second branch detection sheet at the other side of the at least one second branch liquid leakage detection wire are distributed in a staggered manner.

17. The liquid leakage detection sheet according to claim 16, comprising a first break detection wire and a second break detection wire that are provided on the base sheet, wherein the first break detection wire is located at an outer side of the first liquid leakage detection wire, and is spaced apart from the first liquid leakage detection wire; and the second break detection wire is located at an outer side of the second liquid leakage detection wire, and is spaced apart from the second liquid leakage detection wire.

* * * * *